United States Patent [19]
Mogi et al.

[11] Patent Number: 5,266,938
[45] Date of Patent: Nov. 30, 1993

[54] METHOD FOR CALIBRATING A DISPLAY AND APPARATUS FOR IMPLEMENTING THE SAME METHOD

[75] Inventors: Susumu Mogi; Naojiro Tanaka, both of Kanagawa, Japan

[73] Assignee: Leader Electronics Corp., Yokohama, Japan

[21] Appl. No.: 828,602

[22] Filed: Jan. 31, 1992

[30] Foreign Application Priority Data

Jan. 31, 1991 [JP] Japan .................. 3-011308

[51] Int. Cl.⁵ .............................................. G09G 3/00
[52] U.S. Cl. ....................................... 345/204; 345/13; 345/134; 345/126
[58] Field of Search ............... 324/601; 315/364, 370; 73/1 R; 340/720, 724, 727, 789; 382/46

[56] References Cited

U.S. PATENT DOCUMENTS

| | | | |
|---|---|---|---|
| 4,441,057 | 4/1984 | Wrona | 340/720 X |
| 4,737,773 | 4/1988 | Kobayashi | 340/727 X |
| 4,899,082 | 2/1990 | Sands et al. | 315/370 X |
| 4,903,012 | 2/1990 | Ohuchi | 340/724 X |
| 5,050,225 | 9/1991 | Itoh | 340/727 X |
| 5,093,653 | 3/1992 | Ikehira | 340/724 X |

FOREIGN PATENT DOCUMENTS 59-22535 7/1984 Japan .
63-3519 1/1988 Japan .

OTHER PUBLICATIONS

Leader Electronics Corp. catalog for X-Y Display Monitor Module model LBO-51MA issued 1985, and user's manual printed Mar. 1989.

*Primary Examiner*—Ulysses Weldon
*Attorney, Agent, or Firm*—Fish & Richardson

[57] ABSTRACT

A method and apparatus for calibrating the scale of an X-Y display device is provided wherein at least two intersecting linear loci are formed and displayed on the screen of the device to show the X and Y axes of effective coordinates of the display device. The display of intersecting loci facilitates adjustments of the device enabling effective coordinates to be coincided with the coordinates of the scale.

13 Claims, 4 Drawing Sheets

METHOD FOR CALIBRATING A DISPLAY AND APPARATUS FOR IMPLEMENTING THE SAME METHOD

FIELD OF THE INVENTION

The present invention relates to calibration of a display device such as an X-Y monitor scope, and particularly to a method and apparatus for enabling effective display coordinates of a display device to be matched with scale coordinates such as those appearing on the on-screen scale of the device.

BACKGROUND OF THE INVENTION

In general, X-Y monitor scopes using a CRT as a display device include two sets of coordinates, i.e. "effective" display coordinates determined by the CRT per se, characteristics of the circuits associated therewith including an effect caused by the earth magnetism, and scale coordinates defined by a scale directly or separately provided on the screen of the CRT. When such a monitor is used, calibration is necessary in order to first check whether the sets of coordinates coincide with each other. In the calibration, a sine wave is conventionally applied to either the X axis (horizontal axis) input or Y axis (vertical axis) input of the monitor to cause a single linear locus to be displayed on the screen of the CRT so that the locus can be visually compared with the X or Y axis line of the scale coordinates, with which the locus should be aligned. If they deviate from each other, variable parameters of the display characteristics of the CRT scope, that is, the horizontal and vertical positions, horizontal and vertical gains and rotation are adjusted accordingly.

In such a conventional calibration method employing a single calibrating linear locus, since the parameters are adjusted mainly on the basis of either ends of the calibrating locus and the portion considered to be its midpoint, if the calibration is to be conducted more accurately, the number of fine adjustments required would increase thus resulting in a greater amount of time being required for the calibrating operation.

In addition, in stereo X-Y audio monitors, some monitors have, as scale coordinates, orthogonal R and L axes representing the levels of R and L channel signals, respectively, and some other monitors have orthogonal L−R and L+R axes representing a difference (L−R) and a sum (L+R), respectively, of the R-ch and L-ch signals. In the latter case, when either the horizontal L−R axis line or the vertical L+R axis line, which intersect at right angles with each other, is to be calibrated, a difference between the gains of the R channel (horizontal) and L channel (vertical) is extremely difficult to be discriminated from rotation caused by the earth magnetism, thus necessitating the expenditure of further time being taken in the calibration.

Accordingly, an object of the present invention is to provide a method and apparatus for calibrating a display which allows the calibrating operation to be simplified.

Another object of the present invention is to provide an apparatus for producing loci suitable for use in such a calibration.

SUMMARY OF THE INVENTION

In order to achieve the above-described end, according to the present invention, calibrating loci which include a linear locus having a clear midpoint are used.

More specifically, for use with a display apparatus including: display means having a screen for providing a display within a predetermined set of coordinates having at least two dimensional axes intersecting each other, said display means being adapted to receive inputs for the two dimensional axes, respectively, and to display in response thereto a locus on the screen in a first set of coordinates corresponding to the predetermined set of coordinates; and scale means provided on the screen of the display means for defining a second set of coordinates corresponding to the predetermined set of coordinates, a calibrating method according to the present invention for enabling the first set of coordinates to be coincided with the second set of coordinates comprises the steps of: causing the display means to display on the screen at least two linear loci intersecting with each other, said at least two linear loci representing said at least two axes, respectively, of the first set of coordinates; and adjusting the display characteristics of the display means such that the displayed linear loci are aligned with the corresponding ones, respectively, of the at least two axes of the second set of coordinates.

Further, for use with a display apparatus including: display means for providing a display in a predetermined set of coordinates having first and second dimensional axes intersecting each other, said display means being adapted to receive inputs at first-axis and second-axis control circuit input terminals corresponding to the first and second axes, respectively, and to display in response thereto a locus on the screen of the display means in a first set of coordinates corresponding to the predetermined set of coordinates; and scale means provided on the screen of the display means for defining a second set of coordinates corresponding to the predetermined set of coordinates, an apparatus according to the present invention for generating loci to be used in calibration for enabling the first set of coordinates to be coincided with the second set of coordinates, comprises intersecting loci forming means for generating a first pair of first-axis and second-axis component waves and a second pair of first-axis and second-axis component waves substantially alternately in a calibration mode of operation, said first pair of first-axis and second-axis component waves being applied to the first-axis and second-axis control circuit input terminals, respectively, for forming a first linear locus representative of the first axis of said first set of coordinates, said second pair of first-axis and second-axis component waves being applied to the first-axis and second-axis control circuit input terminals, respectively, for forming a second linear locus representative of the second axis of said first set of coordinates, said second linear locus intersecting said first linear locus.

BRIEF DESCRIPTION OF THE DRAWINGS

The present invention will now be described hereinafter in more detail with reference to the accompanying drawings in which.

THE PREFERRED EMBODIMENT

Figure 1:
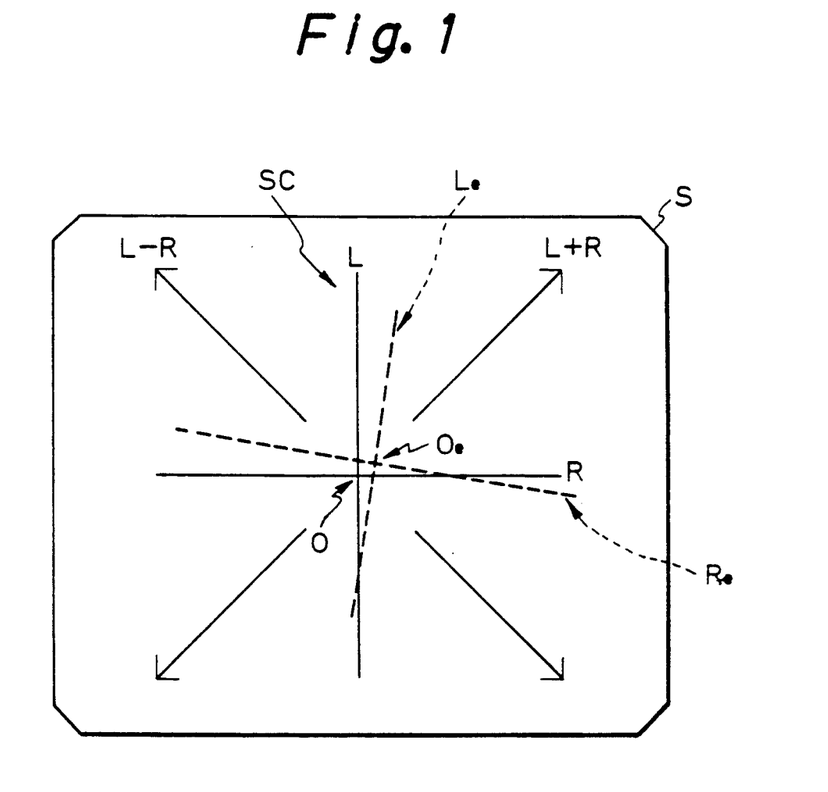
FIG. 1 is a view showing an illustrative scale on the screen of a stereo audio monitor and intersecting loci for calibration according to the present invention.

Referring to FIG. 1, it illustrates an image which is displayed on the CRT screen of an stereo audio monitor in which the present invention is incorporated, during a calibration mode of operation of the monitor. The audio monitor is provided with an on-screen scale SC, which has a horizontal R axis (illustrated in solid line) indicating the level of an R-ch signal and a vertical L axis (also illustrated in solid line) indicating the level of an L-ch signal. An L+R axis (in solid line) and an L−R axis (in solid line) for indicating the levels of the sum (L+R) of the R-ch and L-ch signals and the difference (L−R) between the signals, respectively, are also included. In addition to the axis lines, inclined crossed lines (shown as dotted lines to distinguish them from the axis lines) are provided. These lines constitute intersecting loci for calibration according to the present invention. The approximately horizontal linear locus Re and approximately vertical linear locus Le represent the R and L axes, respectively, of an "effective" set of coordinates of the monitor which should be aligned with the respective R and L axes of the scale. Also, as can be seen from the illustration shown, the deviation of the origin Oe of the effective coordinates from the origin O of the scale coordinates is clear in terms of its magnitude and direction, as compared with a case where only a single linear locus is displayed.

If the intersecting loci are utilized, the calibration of the monitor can be readily made by first making adjustments to the parameters HORIZONTAL POSITION and/or VERTICAL POSITION in the monitor to cause the origin Oe to coincide with the origin O, followed by making an adjustment to the parameter ROTATION to cause the linear loci Re and Le to become aligned with the corresponding axis lines R and L, respectively, and then adjusting the parameters HORIZONTAL GAIN and/or VERTICAL GAIN. Also, the number of times the calibration procedure must be repeated, including partial recalibration, can be kept to a minimum. As will be readily understood, if only the locus Le, for example, is conventionally displayed, such a procedure would be required to be repeated a greater number of times, due to the resulting difficulty in determining to what degree the locus and the corresponding axis line deviate from each other.

Figure 2:
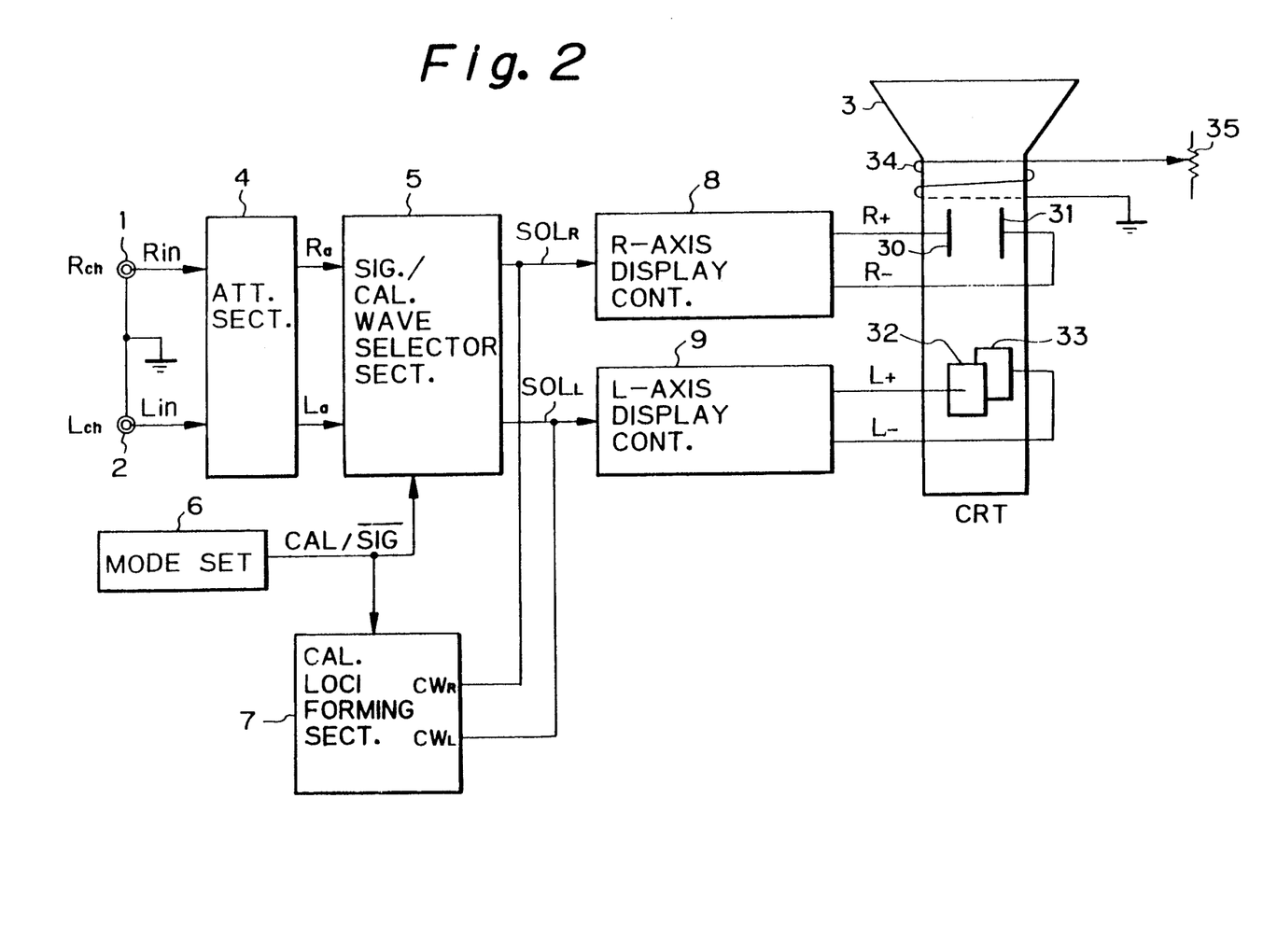
FIG. 2 is a block diagram illustrating a circuit arrangement of a stereo audio monitor which incorporates a calibrating loci forming circuit section according to the present invention.
Figure 3:
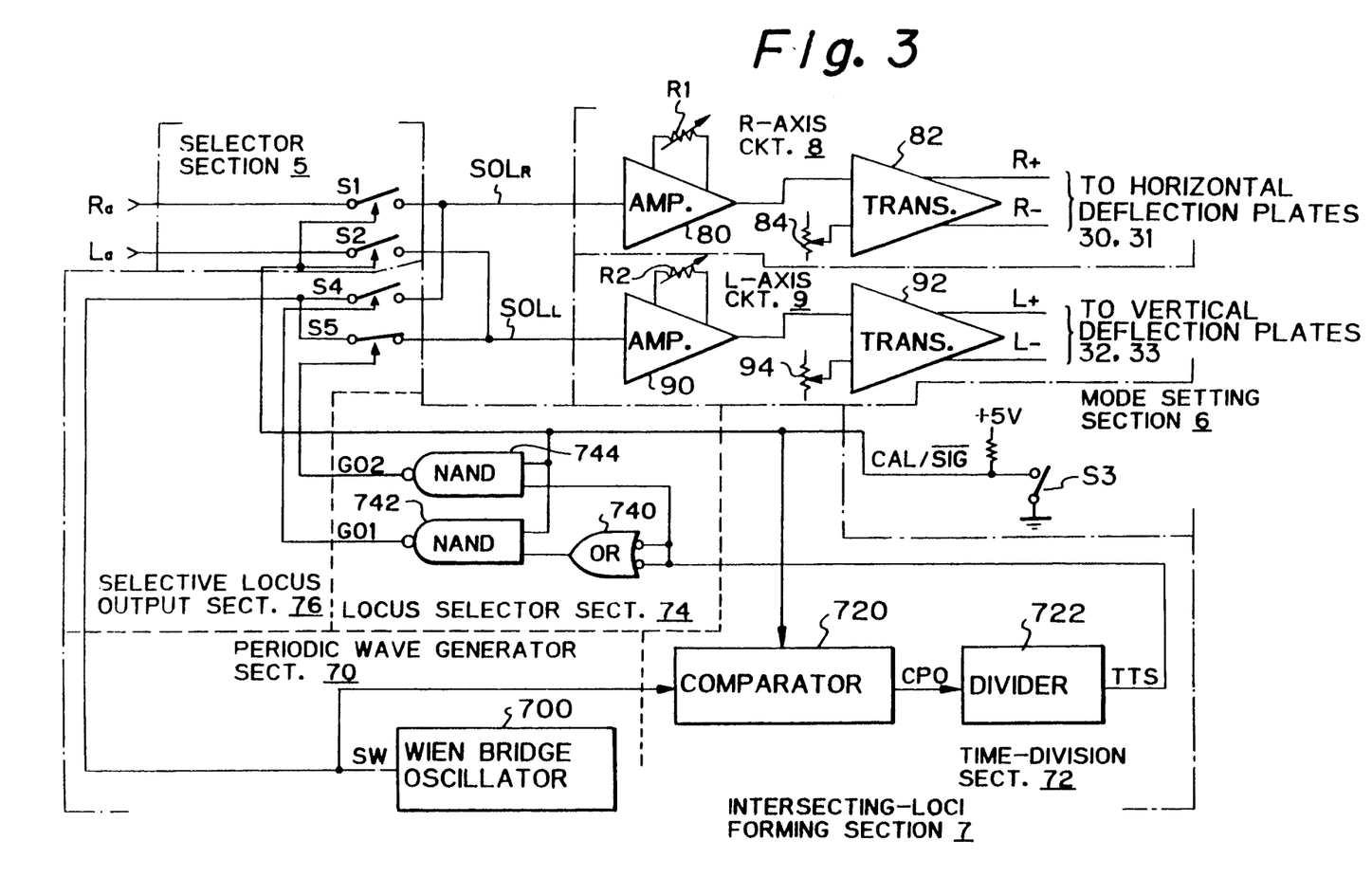
FIG. 3 is a schematic diagram showing a portion of the circuit shown in FIG. 2 in detail.

Next, referring to FIGS. 2 and 3, the circuit of a stereo audio monitor M will be described, in which an intersecting loci generator device according to the present invention is incorporated. The illustrated monitor M includes an R-ch input terminal 1, an L-ch input terminal 2 and a CRT 3. The CRT 3 is arranged such that an R-ch signal is applied across horizontal deflection plates 30 and 31, and that an L-ch signal is applied across vertical deflection plates 32 and 33. For ROTATION adjustment, the monitor includes a coil 34 having one of the ends thereof connected to ground and a variable DC voltage source 35 connected to the other end of the coil 34.

Also, the monitor M includes an attenuator section 4, a signal/calibration wave selector section 5, a mode setting section 6, and an intersecting calibration loci forming section 7, and R-axis and L-axis display control circuits 8 and 9. More specifically, R-ch and L-ch inputs Rin, Lin received at the respective input terminals 1 and 2 are applied to the attenuator 4 which attenuates the received signals at a selected rate and outputs the same. The selector section 5 is comprised of a pair of analog switches S1 and S2 (see FIG. 3: they are turned ON when control inputs for them are low), the inputs of which are connected to receive the attenuated R-ch and L-ch signals Ra, La. The monitor M has a signal mode of operation SIG and a calibration mode of operation CAL. The pair of analog switches pass the signals Ra and La only in the signal mode SIG to selected-output lines $SOL_R$ and $SOL_L$, respectively. Then, the mode setting section 6 includes a switch S3 (see FIG. 3), which outputs a mode command signal CAL/SIG* for specifying either one of the two modes (symbol "*" denotes inversion: the signal indicates the calibration mode CAL when it is high and the signal mode SIG when low). The output is then connected to the control inputs of the switches S1 and S2 (see FIG. 3) of the selector section 5 and to the intersecting loci forming section 7 so as to control them depending on a selected mode.

Then, the forming section 7 according to the present invention generates a pair of R-axis and L-axis component waves $CW_R$ and $CW_L$ required to produce each of the intersecting linear loci Re and Le (FIG. 1) for use in calibration, the component waves of which are output to the selective output lines $SOL_R$ and $SOL_L$, respectively, at the time of the calibration mode CAL, as will be later described in detail. Signals on the selective output lines are applied to the inputs of R-axis and L-axis display control circuits 8 and 9 which include respective variable amplifiers 80 and 90 and respective unbalanced-balanced transforming amplifiers 82 and 92 as shown in FIG. 3. The variable amplifier 80 includes a variable resistor R1 for adjusting HORIZONTAL (R-axis) GAIN while the amplifier 90 includes a variable resistor R2 for the adjustment of VERTICAL (L-axis) GAIN. The unbalanced-balanced amplifier 82 is connected to receive the output of the amplifier 80 at one of the inputs thereof and to receive a voltage from a variable DC voltage source 84 for adjusting HORIZONTAL POSITION at the other input, thereby generating voltages R+ and R− for driving the horizontal deflection plates 30 and 31 at the outputs of the amplifier. Similarly, the unbalanced-balanced amplifier 92 is connected to receive the output of the amplifier 90 at one of the inputs thereof and to receive a voltage from a variable DC voltage source 94 for VERTICAL POSITION adjustment at the other input such that voltages L+ and L− for driving the vertical deflection plates 32 and 33 are generated at the outputs of the amplifier.

Figure 4:
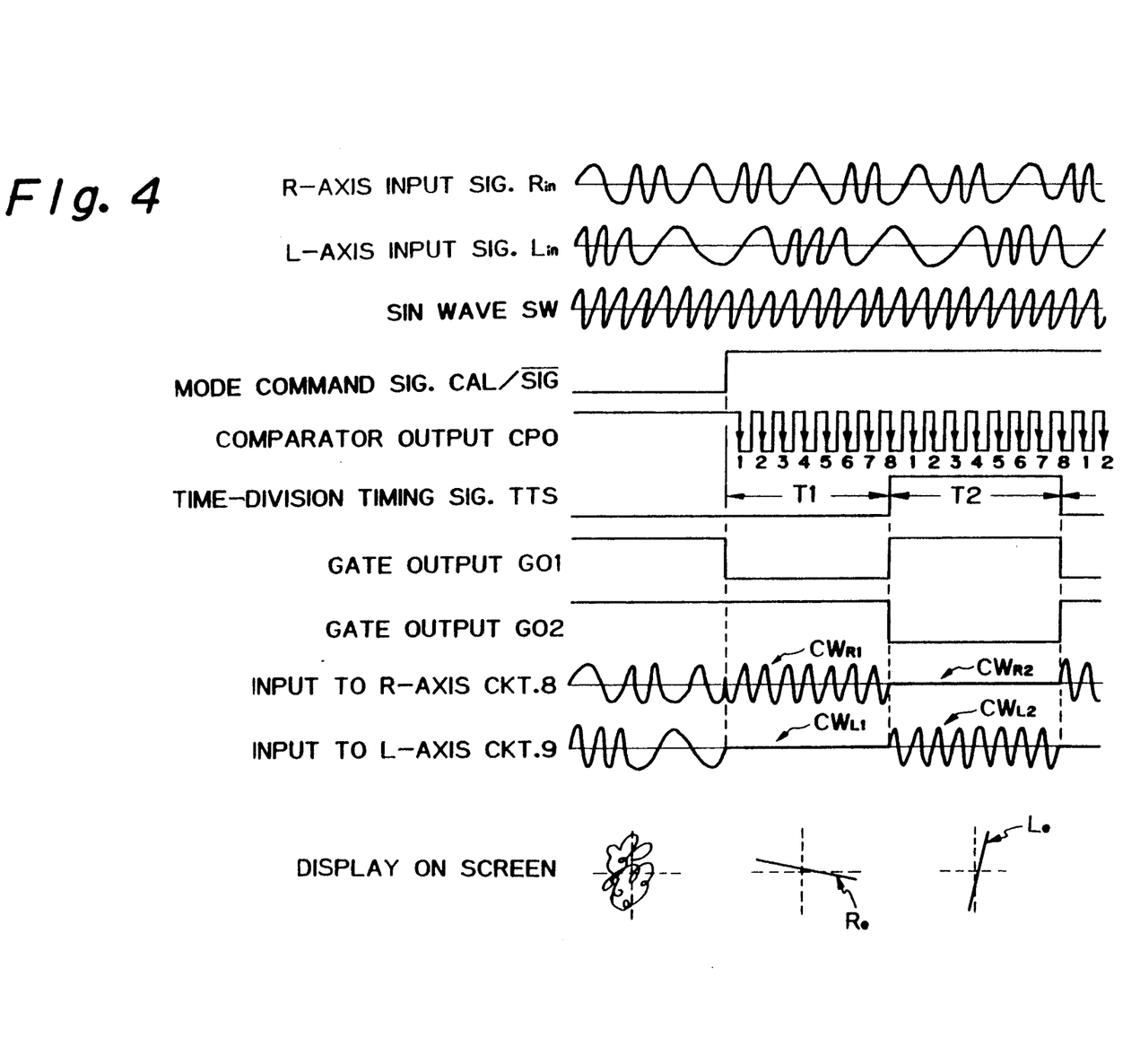
FIG. 4 is a timing chart showing the waveforms of various signals appearing in the circuits shown in FIGS. 2 and 3, with associated displays on the CRT screen.

Now, referring to FIG. 3, the intersecting-loci forming section 7 will be described in detail. The forming section is generally comprised of a periodic wave generator section 70, a time division section 72, a locus selector section 74 and a selective locus output section 76. Firstly, the periodic wave generator 70 comprises a Wien bridge oscillator 700 to generate a sine wave SW of 1 KHz the waveform of which is shown in FIG. 4. It should be noted that the sine wave SW has a predetermined amplitude, because the amplitude influences the length of each of the linear loci Re and Le on the CRT screen. Then, the time division section 72 functions to divide the period of time for displaying the calibration loci into periods during which the two linear loci Re and Le are displayed successively, and the section 72 includes a comparator 720 and a frequency divider 722.

The comparator 720 has one of the inputs thereof connected to the output of the oscillator 700, and the other enable input connected to receive the mode command signal CAL/SIG*. The comparator operates to generate a comparator output CPO which is high when the enable input is low. When the enable input is high, the comparator output CPO will be equal to a result derived from the comparison of the oscillator output SW with an internal predetermined threshold value of the comparator 720. Thus, as seen from FIG. 4, the comparator output CPO is high in level when the mode command signal is low indicating the signal mode SIG, and a square wave of the same frequency as that of the sine wave SW when the mode command signal is high indicating the calibration mode. Then, the frequency divider 722 is operative to divide by eight the comparator output CPO (note: the ratio of division can be changed into any other ratio as long as the loci Re and Le can be simultaneously viewed on the CRT screen), and the resultant square wave of ⅛ KHz is output during the calibration mode. Thus, the divider output is called a time-division timing signal TTS, because the output determines time periods T1, T2 . . . for displaying the two loci Re and Le on the CRT screen in a time shared manner.

A locus selector 74 which is connected to receive the signal TTS and the mode command signal serves to alternately select one of the two linear loci to be displayed during each of the time divided periods T1, T2 . . . in the calibration mode. The selector 74 is comprised of an OR gate 740 and two NAND gates 742 and 744. The OR gate 740 functions as an inverter and, hence, the output of the gate is equal to the inversion of the received time-division timing signal TTS. The NAND gate 742 which is connected to receive the OR gate output and the mode command signal, generates a gate output GO1 which assumes a high level during the signal mode and a logical state being equal to that of the signal TTS after the mode is switched into the calibration mode, as shown in FIG. 4. On the other hand, the gate 744 which is connected to receive the signal TTS and the mode command signal, generates a gate output GO2 which assumes a high level during the signal mode and a logical state opposite to that of the signal TTS during the calibration mode. The gate outputs GO1 and GO2 serve as the signal for selecting one of two loci Re and Le. If the outputs GO1 and GO2 assume low and high levels, respectively, then the horizontal locus Re is selected, while if the outputs assume high and low levels, respectively, then the other vertical locus Le is selected.

Finally, the gate outputs and the sine wave SW are applied to the selective locus output section 76 which forms and generates an R-axis component wave $CW_R$ and an L-axis component wave $CW_L$ during the calibration mode which are required to cause a selected locus to be displayed on the screen. When functioning in the signal mode, the section 76 operates to stop the outputting of the component waves. As shown, the section 76 comprises a pair of analog switches S4 and S5 each of which is turned ON when the respective control input is low. Both switches have their respective inputs connected to receive the sine wave SW. Also, the switch S4 receives the gate output GO1 at the control input thereof, and the control input of the switch S5 is connected to receive the gate output GO2. Thus, the switch S4 is turned OFF during the signal mode, while in the calibration mode, the switch is turned ON only during each of odd numbered periods (only T1 is shown) to output the sine wave SW to the selective output line $SOL_R$ (during even numbered periods, the switch is turned OFF, resulting in a zero level on the line $SOL_R$). Similarly, the switch S5 is also turned OFF during the signal mode. During the calibration mode, however, the switch S5 is turned ON only during each of the even numbered periods (only T2 is shown) to output the sine wave SW on the selective output line $SOL_L$ (during the odd numbered periods, the switch is turned OFF, causing the line $SOL_L$ to assume a zero level.). That is, the R-axis and L-axis component waves $CW_R$ and $CW_L$ are equal to a sine wave SW ($CW_{R1}$) and a zero level waveform ($CW_{L1}$), respectively, during the odd numbered periods, and a zero level waveform ($CW_{R2}$) and a sine wave SW ($CW_{L2}$), respectively, during the even numbered periods. Thus, inputs applied to the respective R-axis and L-axis circuits 8 and 9 take the waveforms shown in FIG. 4.

Next, the operation of the above-described monitor M will be explained briefly hereinafter. In the first place, it is assumed that the monitor receives input signals Rin and Lin having the waveforms shown in FIG. 4. Then, when the switch S3 is ON setting the monitor M in the signal mode SIG, since the switches S1 and S2 are turned ON so that the attenuated input signals Ra and La are applied to the circuits 8 and 9, a locus as shown in FIG. 4 is displayed on the CRT screen (note: in FIG. 4, the crossed dotted lines represent the R-axis and L-axis of the scale on the CRT screen.). Then, if the switch S3 is turned OFF for the calibration of the monitor, the switches S1 and S2 are turned OFF by the high command signal CAL/SIG*, and also the switches S4 and S5 are alternately turned ON, resulting in a locus Re being displayed during odd numbered periods and a locus Le being displayed during even numbered periods. Since the loci Re and Le are observed to be visually simultaneously displayed although they are displayed alternately, intersecting loci for calibration such as shown in FIG. 1 appear on the screen. As a result, for the calibration of the monitor, a user can adjust the variable voltage source 35, variable resistors R1 and R2 and variable voltage sources 84 and 94 while observing the calibration loci.

In the above-described embodiment of the present invention, several changes and modifications can be made. First, the present invention can be applied to another type of stereo audio monitors, i.e. a sum/difference-displayed stereo audio monitor having a scale which is equivalent to the on-screen scale SC shown in FIG. 1 rotated 45 degrees in counterclockwise (the sum/difference-displayed monitor includes a sum/difference circuit being added in between a pair of amplifiers 80 and 90 and a pair of amplifiers 82 and 92 such that the sum of the outputs of the amplifiers 80 and 90 is applied to the amplifier 92 while the difference between the outputs is applied to the amplifier 82). Also, the present invention can be applied to any other type of X-Y monitors. Secondly, the number of linear loci to be displayed can be increased to more than two. For example, the linear loci corresponding to the L+R axis and the L−R axis of the scale shown in FIG. 1 can be displayed. Also, any linear locus which corresponds to a line extending in parallel or non-parallel to the axis line L or R can be displayed. In such a case, the above mentioned time-divided periods may also be allocated to such additional loci sequentially.

According to the present invention described above in detail, the calibration of display devices can be carried out more accurately with ease. Further, the calibration of the present invention may be useful in environments such as where the adjustment of monitors is conducted during manufacture, and where frequent calibrations are necessary such as in monitors provided in vehicles.

What is claimed is:

1. In a display apparatus for providing a display within a predetermined set of coordinates having at least two dimensional axes including first and second axes intersecting each other, said display apparatus including a screen and being adapted to receive inputs for said first and second axes, respectively, for displaying in response thereto a locus on the screen within a first set of coordinates corresponding to said predetermined set of coordinates, said display apparatus further including:

display means including:
   an electrostatic deflection cathode ray tube including said screen, a first pair of deflection plates associated with said first axis, a second pair of deflection plates associated with said second axis and rotation adjusting coil means, and
   first-axis and second-axis deflection control means connected to said first and second pairs of deflection plates, respectively; and
   scale means provided on the screen of said display means for defining a second set of coordinates corresponding to said predetermined set of coordinates, a calibration method for enabling said first set of coordinates to be coincided with said second set of coordinates, comprising the steps of:
   a. applying calibration signals to said first-axis and second-axis deflection control means of said display means to cause said display means to display on the screen at least two linear loci intersecting each other, said at least two intersecting linear loci representing said at least said first and second axes, respectively, of said first set of coordinates; and
   b. adjusting display characteristics of said display means to cause said displayed linear loci to be aligned with corresponding ones of said at least first and second axes of said second set of coordinates by adjusting at least one of said first axis deflection control means, said second-axis deflection control means and rotation adjusting coil means.

2. A calibration method as set forth in claim 1 wherein said display apparatus comprises an X-Y monitor having a CRT and an on-screen scale, and said first and second axes comprising an X axis representing a horizontal axis and a Y axis representing a vertical axis, said first-axis deflection control means comprising a horizontal-axis deflection control circuit with adjustable horizontal position and gain, said second-axis deflection control means comprising a vertical-axis deflection control circuit with adjustable vertical position and again, and said rotation adjusting coil means comprising a rotation adjusting coil and a variable DC voltage source: and
   said adjusting step including the step of adjusting said display characteristics by means of parameters including horizontal and vertical positions, horizontal and vertical gains and rotation of said X-Y monitor.

3. A calibration method as set forth in claim 2 wherein said X-Y monitor comprises a stereo audio monitor, said X axis being an R axis representing the level of an R-ch signal of a stereo signal, said Y axis being an L axis representing the level of an L-ch signal of said stereo signal.

4. A calibration method as set forth in claim 2 wherein said X-Y monitor comprises a stereo audio monitor, said X axis being an L−R axis representing the level of a difference between R-ch and L-ch signals of a stereo signal, said Y axis being an L+R axis representing the level of a sum of said R-ch and L-ch signals.

5. A display apparatus for providing a display within a predetermined set of coordinates having first and second axes intersecting each other, wherein said display apparatus includes:

display means for displaying a locus on a screen within a first set of coordinates corresponding to said predetermined set of coordinates in response to inputs received, said display means including:
   an electrostatic deflection cathode ray tube including said screen, a first pair of deflection plates associated with said first axis, a second pair of deflection plates associated with said second axis and rotation adjusting loci means;
   first-axis deflection control circuit means having a first-axis deflection control input terminal for receiving an input associated with the first-axis and outputs connected to said first pair of deflection plates, said deflection control circuit means including means for adjusting a first-axis directional position and means for adjusting a first-axis directional gain; and
   second-axis deflection control circuit means having a second-axis deflection control input terminal for receiving an input associated with the second-axis and outputs connected to said second pair of deflection plates, said deflection control circuit means including means for adjusting a second-axis directional position and means for adjusting a second-axis directional gain
   scale means provided on the screen of said display means for defining a second set of coordinates corresponding to said predetermined set of coordinates;
   means for generating loci used in calibration enabling said first set of coordinates to be coincided with said second set of coordinates said loci generating means including intersecting loci forming means for generating a first pair of first-axis and second-axis component waves and a second pair of first-axis and second-axis component waves substantially alternately in a calibration mode of operation, said first pair of first-axis and second-axis component waves being applied to the first-axis and second-axis deflection control input terminals, respectively, of said display means for forming a first linear locus representative of said first axis of said first set of coordinates, said second pair of first-axis and second-axis component waves being applied to the first-axis and second-axis deflection control input terminals, respectively, for forming a second linear locus representative of said second axis of said first set of coordinates, said second linear locus intersecting said first linear locus; and
   means for calibrating the display by adjusting at least one of said first-axis directional position adjusting means, said first-axis directional gain adjusting means, said second axis direction position adjusting means, said second-axis directional gain adjusting means, and rotation adjusting coil means of said display means to cause said displayed linear loci to be aligned with corresponding ones of said first and second axes of said second set of coordinates.

6. A display apparatus as set forth in claim 5 wherein said intersecting loci forming means comprises:
   a. generator means for generating a periodic wave;
   b. time division means for generating a timing signal for defining first and second periods of time alternating in a predetermined frequency, one of said first and second linear loci being displayed for said first period of time and the other being displayed for said second period of time;
   c. locus selector means being responsive to said timing signal for generating a select signal for selecting said one linear locus for said first period of time and said other linear locus for said second period of time; and
   d. output means connected to receive said select signal and said periodic wave for outputting said first pair of component waves generated from said periodic wave to said first-axis and second-axis deflection control input terminals, respectively, when said first linear locus is selected by the select signal, and for outputting said second pair of component waves generated from said periodic wave to said first-axis and second-axis deflection control input terminals, respectively, when said second linear locus is selected by the select signal.

7. A display apparatus as set forth in claim 6 wherein:
   said periodic wave comprises a sine wave;
   said first pair of first-axis and second-axis component waves comprising a sine wave having a predetermined amplitude and a waveform having a zero level, respectively; and
   said second pair of first-axis and second-axis component waves comprising a waveform having a zero level and a sine wave having a predetermined amplitude, respectively.

8. A display apparatus as set forth in claim 7 wherein said output means comprises:
   a. first switch means connected between an output of said generator means and said first-axis deflection control input terminal; and
   b. second switch means connected between the output of said generator means and said second-axis deflection control input terminal, and
   said locus selector means including:
   switch control means for generating as said select signal first and second ON/OFF control signals for controlling said first and second switch means, respectively, said first ON/OFF control signal being operative to turn ON said first switch means while said timing signal indicates said first period of time and to turn OFF said first switch means while said timing signal indicates said second period of time, said second ON/OFF control signal being operative to turn OFF said second switch means while said timing signal indicates said first period of time and to turn ON said second switch means while the timing signal indicates said second period of time.

9. A display apparatus as set forth in claim 8 wherein said display apparatus comprises:

a. mode command means for generating a mode command signal indicating either one of said calibration mode and another ordinary mode;
   b. first-axis and second-axis input terminals;
   c. third switch means connected between said first-axis input terminal and said first-axis deflection control input terminals, said third switch means having a control input; and
   d. fourth switch means connected between said second-axis input terminal and said second-axis deflection control input terminal, said fourth switch means having a control input, and
   said mode command signal being operative to turn OFF said third and fourth switch means during the time when the command signal indicates said calibration mode and to turn ON said third and fourth switch means during the time when the command signal indicates said ordinary mode; and
   said switch control means being adapted to respond to said mode command signal for generating said first and second ON/OFF control signals serving to force both of said first and second switch means to be turned OFF during the time when the command signal indicates said ordinary mode.

10. In a display apparatus for providing a display within a predetermined set of coordinates having first and second axes intersecting each other, wherein said display apparatus includes: display means for displaying a locus on a screen within a first set of coordinates in response to inputs received, said display means including first-axis and second-axis control circuit input terminals for receiving inputs associated with the first and second axes, respectively; and scale means provided on the screen of said display means for defining a second set of coordinates corresponding to said predetermined set of coordinates, an apparatus for generating loci used in calibration enabling said first set of coordinates to be coincided with said second set of coordinates comprising:
   intersecting loci forming means for generating a first pair of first-axis and second-axis component waves and a second pair of first-axis and second-axis component waves substantially alternately in a calibration mode of operation, said first pair of first-axis and second-axis component waves being applied to the first-axis and second-axis control circuit input terminals, respectively, of said display means for forming a first linear locus representative of said first axis of said first set of coordinates, said second pair of first-axis and second-axis component waves being applied to the first-axis and second-axis control circuit input terminals, respectively, for forming a second linear locus representative of said second axis of said first set of coordinates, said second linear locus intersecting said first linear locus;
   wherein said intersecting loci forming means comprises:
   a. generator means for generating a periodic wave;
   b. time division means for generating a timing signal for defining first and second periods of time alternating in a predetermined frequency, one of said first and second linear loci being displayed for said first period of time and the other being displayed for said second period of time;
   c. locus selector means being responsive to said timing signal for generating a select signal for selecting said one linear locus for said first period of time and said other linear locus for said second period of time; and d. output means connected to receive said select signal and said periodic wave for outputting said first pair of component waves generated from said periodic wave to said first-axis and second-axis control circuit input terminals, respectively, when said first linear locus is selected by the select signal, and for outputting said second pair of component waves generated from said periodic wave to said first-axis and second-axis control circuit input terminals, respectively, when said second linear locus is selected by the select signal.

11. A display apparatus as set forth in claim 10 wherein:

said periodic wave comprises a sine wave;

said first pair of first-axis and second-axis component waves comprising a sine wave having a predetermined amplitude and a waveform having a zero level, respectively; and said second pair of first-axis and second axis component waves comprising a waveform having a zero level and a sine wave having a predetermined amplitude, respectively.

12. A display apparatus as set forth in claim 11 wherein said output means comprises:

a. first switch means connected between an output of said generator means and said first-axis control circuit input terminal; and b. second switch means connected between the output of said generator means and said second-axis control circuit input terminal, and said locus selector means including:

switch control means for generating as said select signal first and second ON/OFF control signals for controlling said first and second switch means, respectively, said first ON/OFF control signal being operative to turn ON said first switch means while said timing signal indicates said first period of time and to turn OFF said first switch means while said timing signal indicates said second period of time, said second ON/OFF control signal being operative to turn OFF said second switch means while said timing signal indicates said first period of time and to turn ON said second switch means while the timing signal indicates said second period of time.

13. A display apparatus as set forth in claim 12 wherein said display apparatus comprises:

a. mode command means for generating a mode command signal indicating either one of said calibration mode and another ordinary mode;

b. first-axis and second-axis input terminals;

c. third switch means connected between said first-axis input terminal and said first-axis control circuit input terminals, said third switch means having a control input; and d. fourth switch means connected between said second-axis input terminal and said second-axis control circuit input terminal, said fourth switch means having a control input, and said mode command signal being operative to turn OFF said third and fourth switch means during the time when the command signal indicates said calibration mode and to turn ON said third and fourth switch means during the time when the command signal indicates said ordinary mode; and said switch control means being adapted to respond to said mode command signal for generating said first and second ON/OFF control signals serving to force both of said first and second switch means to be turned OFF during the time when the command signal indicates said ordinary mode.

* * * * *